(12) United States Patent
Mansour

(10) Patent No.: US 8,543,884 B2
(45) Date of Patent: Sep. 24, 2013

(54) COMMUNICATIONS CHANNEL PARALLEL INTERLEAVER AND DE-INTERLEAVER

(75) Inventor: Mohamad Mansour, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 964 days.

(21) Appl. No.: 12/485,794

(22) Filed: Jun. 16, 2009

(65) Prior Publication Data

US 2010/0318878 A1    Dec. 16, 2010

(51) Int. Cl.
*H03M 13/00*    (2006.01)

(52) U.S. Cl.
USPC .......................................... 714/755; 714/777

(58) Field of Classification Search
None
See application file for complete search history.

(56) References Cited

U.S. PATENT DOCUMENTS

| | | | |
|---|---|---|---|
| 7,200,181 B2 * | 4/2007 | Kim et al. ..................... | 375/262 |
| 7,543,197 B2 * | 6/2009 | Palanki et al. ................ | 714/701 |
| 7,826,414 B2 * | 11/2010 | Odenwalder et al. ......... | 370/329 |
| 7,953,062 B2 * | 5/2011 | Sindhushayana et al. .... | 370/345 |
| 2002/0114401 A1 * | 8/2002 | Kim et al. ..................... | 375/262 |
| 2003/0063606 A1 * | 4/2003 | Odenwalder et al. ......... | 370/389 |
| 2006/0114910 A1 * | 6/2006 | Sindhushayana et al. .... | 370/394 |
| 2006/0156199 A1 * | 7/2006 | Palanki et al. ................ | 714/776 |
| 2008/0225965 A1 * | 9/2008 | Pi et al. ......................... | 375/260 |
| 2009/0113274 A1 * | 4/2009 | Lee ................................ | 714/776 |

* cited by examiner

*Primary Examiner* — Guerrier Merant
(74) *Attorney, Agent, or Firm* — Stanton Braden

(57) ABSTRACT

A parallel interleaver that operates to interleave convolutionally and turbo encoded data packets is described. Packets are divided into subpackets and interleaved in parallel for improved performance. The Pruned Bit Reversal Interleaver (PBRI) function used to generate interleaver addresses is invertible such that its inverse function can be used to generate de-interleaver addresses. For convolutionally encoded subpackets, encoder output bits are demultiplexed into three sequences $V_0, V_1, V_2$ with the first bit going to $V_0$, the second bit going to $V_1$, the third going to $V_2$, and the fourth to $V_0$, etc. Next, each of the three sequences is bit-permuted independently using PBRIs to generate the sequences $\pi(V_0)$, $\pi(V_1)$, $\pi(V_2)$. For turbo encoded subpackets, the encoder $N_T$ output data bits are demultiplexed into five sequences $U, V_0, V_1, V'_0, V'_1$. Next, the demultiplexed sequences are bit-permuted using five PBRIs into three separate interleaved blocks, denoted as $\pi(U)$, $\pi(V_0/V'_0)$, and $\pi(V_1/V'_1)$.

22 Claims, 12 Drawing Sheets

COMMUNICATIONS CHANNEL PARALLEL INTERLEAVER AND DE-INTERLEAVER

BACKGROUND

1. Field

The present invention relates generally to digital communications systems, and more specifically to a method and hardware architecture for parallel channel interleaving and de-interleaving.

2. Background

Digital communication systems use numerous techniques to increase the amount of information transferred while minimizing transmission errors. In these communication systems, the information is typically represented as a sequence of binary bits or blocks of bits called frames. The binary information is modulated to signal waveforms and transmitted over a communication channel. Communication channels tend to introduce noise and interference that corrupt the transmitted signal. At a receiver, the received information may be corrupted and is an estimate of the transmitted binary information. The number of bit errors or frame errors depends on the amount of noise and interference in the communication channel.

To counter the effects of transmission channel corruption, channel interleaving error correction coding is often used in digital communication systems to protect the digital information from noise and interference and reduce the number of bit/frame errors. Channel interleaving is employed in most modern wireless communications systems to protect against burst errors. A channel interleaver reshuffles encoded symbols in such a way that consecutive symbols are spread apart from each other as far as possible in order to break the temporal correlation between successive symbols involved in a burst of errors. A reverse de-interleaving operation is performed at the receiver side before feeding the symbols to a channel decoder. Typically, this interleaving, and subsequent de-interleaving are performed in an inefficient serial manner.

There is therefore a need in the art for a faster and more efficient parallel method of interleaving and de-interleaving having improved performance. Moreover, there is a need for the improved parallel interleaving and de-interleaving to have an easily implemented hardware architecture that can be constructed using basic logic gates with a short critical path delay.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The word "packet" is used herein to mean formatted unit of data. The word "subpacket" is used herein to mean a portion of a packet. The words "packet" and "subpacket" may be used interchangeably herein.

Figure 1:
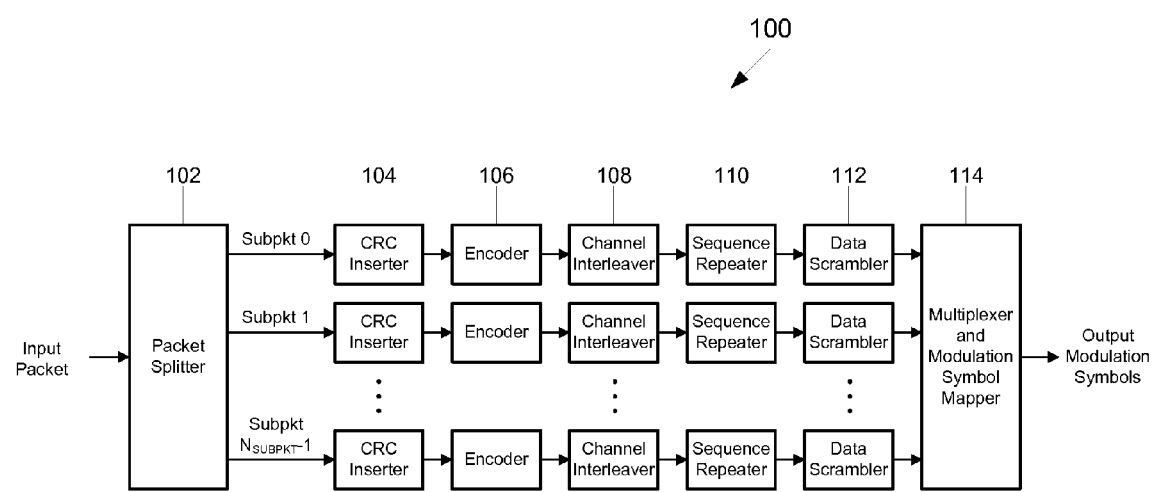
FIG. 1 shows an exemplary high level parallel interleaver coding and interleaving structure.

FIG. 1 shows an exemplary parallel interleaver coding and interleaving structure 100. Packet Splitter 102 applies packet splitting to incoming data channel packets (as well as forward broadcast and multicast services channels), where a packet is divided into one or more smaller subpackets of maximum length defined by a constant in the physical (PHY) layer protocol. Subpackets can be configured to have bit-lengths ranging from 32 to 16,384 in multiples of 8. A sequence of operations consisting of Cyclic Redundancy Check (CRC) insertion performed by CRC inserter 104, convolutional or turbo encoding performed by encoder 106 detailed in FIG. 2(a) and 3(a), channel interleaving performed by channel interleaver 108, sequence repetition performed by sequence repeater 110, and data scrambling performed by data scrambler 112, is performed independently on each subpacket (–Subpacket 0 . . . Subpacket$_{NSUBPKT-1}$). Multiplexing and symbol modulation mapping is performed by Multiplexer 114 to produce output modulation symbols. Other non-data channel packets are not subject to subpacketization, and the sequence of aforementioned operations is applied on the complete packet. The terms "packet" and "subpacket" may be used interchangeably herein. At a receiver, a packet is declared in error if any of its constituent subpackets are in error.

CRC bits are appended by CRC inserter 104 to the incoming information bits of a subpacket for the purpose of error detection at a receiver. The CRC bits are generated by clocking a 24-stage shift-register with a generator function. In one embodiment, the generator function is 0x1864CFB. The shift-register is initialized to logic one, and then clocked a number of times equal to the number of input bits in the subpacket. Next, the register is clocked an additional number of times equal to the number of CRC bits to be generated ($\leq 24$) with the input disconnected. These output bits generated from the shift-register constitute the CRC bits and are appended to the incoming information bits in the order they are generated. For data channel packets, the number of CRC bits is 24. For other channels some of the CRC bits may be truncated.

Forward Error Correction

Figure 2A:
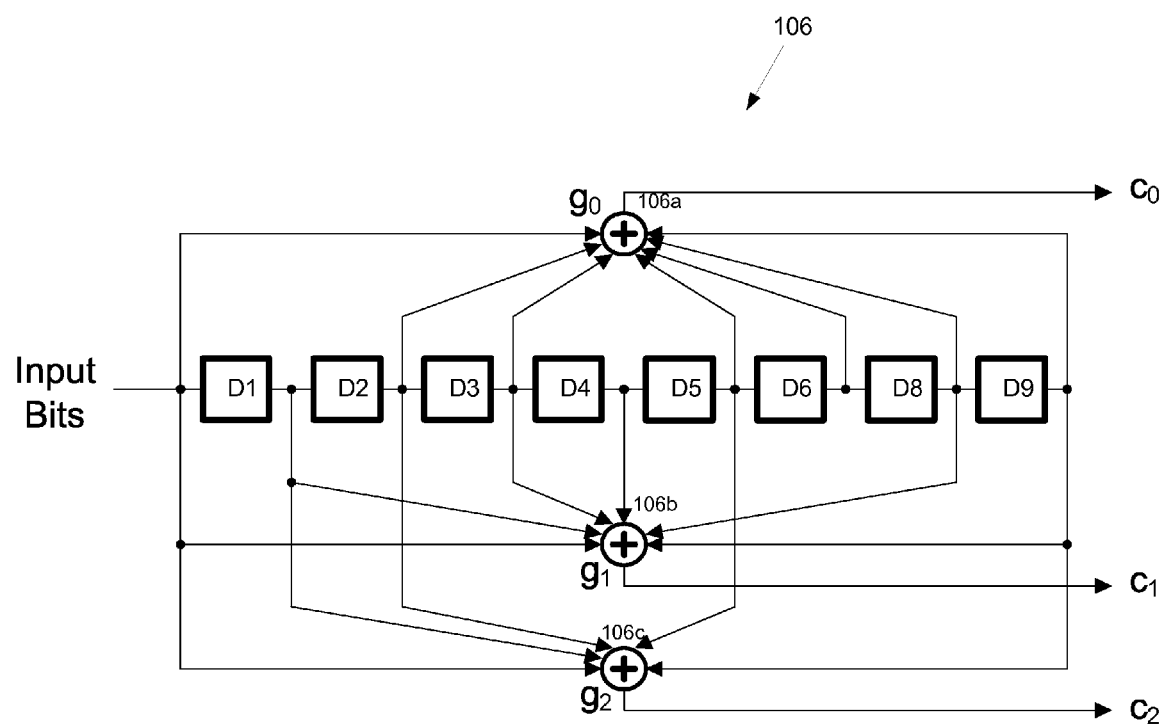
FIG. 2(a) is a block diagram of an exemplary convolutional encoder that can be used for parallel interleaving.

FIG. 2(a) is a block diagram of an exemplary embodiment of the encoder 106 component of the parallel interleaver coding and interleaving structure 100, for performing convolutional encoding. A rate-1/3 convolutional code is used to encode CRC-padded control channel subpackets as well as CRC-padded data channel packets of length ($N_v$) 128 bits or less. The constraint length of the rate-1/3 code is nine for generator functions $g_0$ 106a, $g_1$ 106b, and $g_2$ 106c. In one exemplary embodiment, the generator functions are $g_0 = 557_{(8)}$, $g_1 = 663_{(8)}$ and $g_2 = 711_{(8)}$ for memory elements $D_1$, $D_2$ $D_3$, $D_4$, $D_5$, $D_6$, $D_7$ and $D_8$. The input bits to the encoder consist of the CRC-padded subpacket appended with eight all-zero tail bits to reset the encoder state when encoding of a packet is complete. The length of an encoded packet in this exemplary embodiment is $3(N_v+8)$.

Figure 3A:
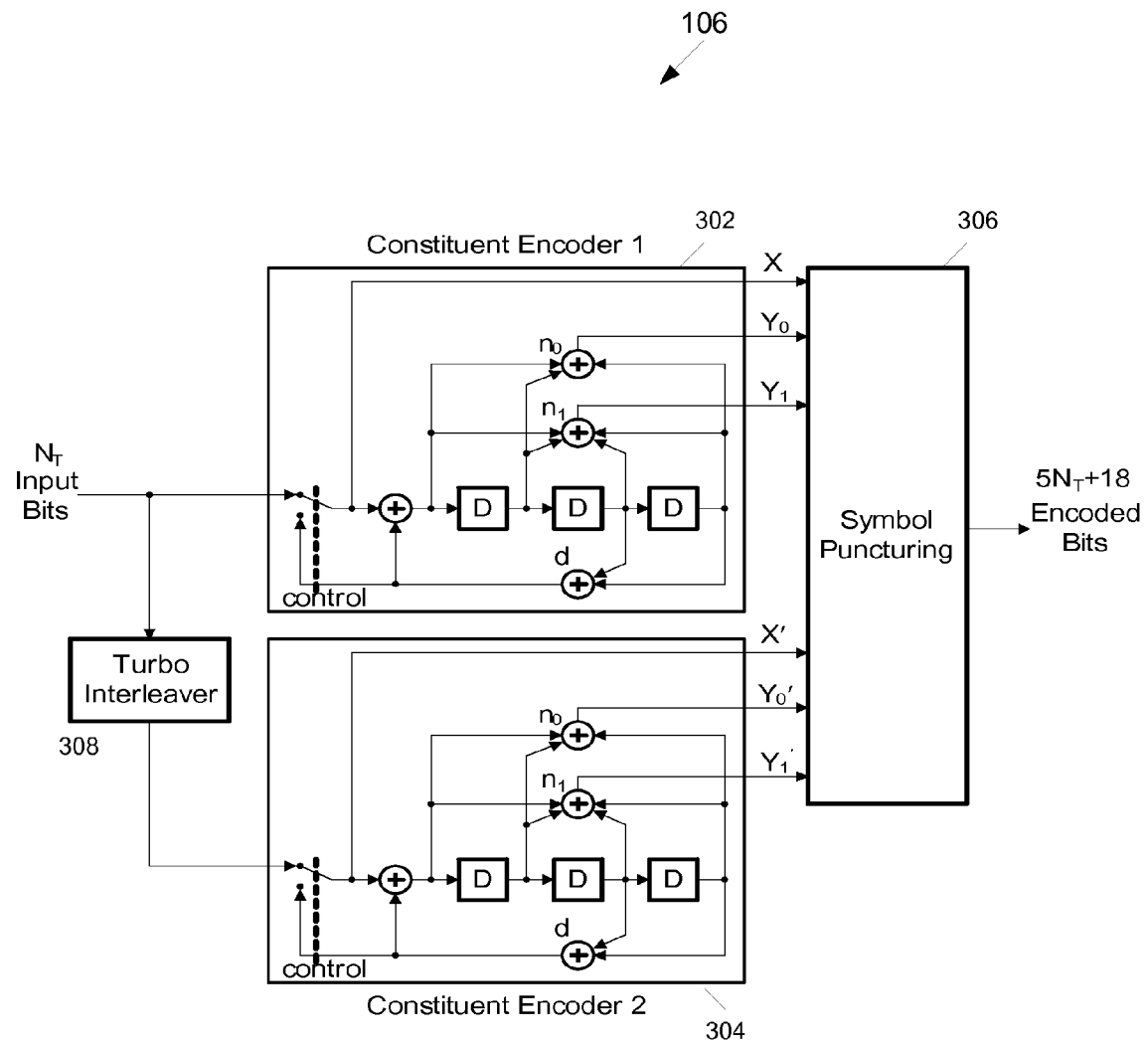
FIG. 3(a) is a block diagram of an exemplary turbo encoder that can be used for parallel interleaving.

FIG. 3(a) is a block diagram of another embodiment of encoder 106 for a rate-1/5 turbo code encoder used to encode CRC-padded data channel subpackets of length 128 bits or more. The constituent codes of the turbo code are two (302 and 304) rate-1/3, contraint-length-4, systematic, recursive convolutional encoders with identical transfer functions of $G(D)=[1 \ n_0(D)/d(D) \ n_1(D)/d(D)]$, where $d(D)=1+D^2+D^3$, $n_0(D)=1+D+D^3$, and $n_1(D)=1+D+D^2+D^3$.

The turbo encoder 106 generates $5N_T+18$ encoded output bits, where $N_T$ is the number of encoder input bits. The first $5N_T$ output bits are the encoder output data bits, which are generated by clocking the constituent encoders (302 and 304) once for every input bit with the switches in the upwards position, and puncturing out the systematic output bits X' from the second constituent encoder 304 with symbol puncturing component 306. The sequence of constituent encoder (302 and 304) output bits for each input bit is $XY_0Y_1Y'_0Y'_1$. The last 18 tail bits are generated after the constituent encoder (302 and 304) has been clocked for $N_T$ cycles with the switches held in the upwards position. The first 9 tail bits are generated by clocking the first constituent encoder 302 three times with the switch held in the downwards position, with the sequence of output bits being $XY_0Y_1$. The last nine tail bits are generated by clocking the second constituent encoder 304 three times with the switch held in the downwards position while constituent encoder 1 302 is not clocked. The sequence of output bits from constituent encoder 2 304 in this case is $X'Y'_0Y'_1$. The 18 tail bits ensure that both constituent encoders (302 and 304) are reset to the all-zero state after encoding a subpacket.

The exemplary turbo channel interleaver 308 is based on Linear Congruential Sequences (LCS). It interleaves subpackets of length between 128 bits and 16,384 bits, but can be applied to any arbitrary length. The sequence of interleaver output addresses generated by an LCS turbo interleaver 308 is equivalent to the sequence obtained by the following process. A 2D R×C array is filled with a sequence of linear addresses row by row from top to bottom, the entries of the array are shuffled according to a procedure to be described next, and the resulting shuffled entries are read column by column from left to right. The shuffling of the array entries is based on applying an independent permutation to the column entries in every row, and then permuting the order of the rows. First, a small positive integer r is chosen depending on the memory bank architecture of the interleaver. In one embodiment, r is set to 5 so that the interleaver memory is composed of 32 banks.

Next, the smallest positive integer n such that $N_T \leq 2^{r+n}$ is determined. This is equivalent to finding the smallest sized $2^r \times 2^n$ array that can hold the $N_T$ entries. The $2^n$ entries of each row are interleaved independently using a linear congruential sequence recursion whose parameters are determined using a 2D look-up table (LUT) based on the row index and n. The result of this operation is a set of new interleaved column indices. Next, the $2^r$ rows are shuffled in bit-reversed order. The result of this operation is a set of new interleaved row indices.

Finally, the interleaved addresses are formed by concatenating the corresponding interleaved column and row indices in opposite order with respect to their order in the linear address. The last step is equivalent to reading the interleaved array entries in the opposite order (i.e., column by column) to which it was filled in (i.e., row by row). If the resulting interleaved address is greater than or equal to $N_T^1$, then it is pruned away and the same operations are repeated on the next consecutive address in linear order.

Let x be an (r+n)-bit linear address, and $y=\rho_{r,n}(x)$ be the corresponding (r+n)-bit turbo-interleaved address. Then, $\rho_{r,n}(x)$ is given by:

$$\rho_{r,n}(x) = \qquad (1)$$
$$2^n \cdot \pi_r(x \bmod 2^r) + \left[\left[\left(\left\lfloor \frac{x}{2^r} \right\rfloor + 1\right) \bmod 2^n\right] \times LUT(x \bmod 2^r, n)\right] \bmod 2^n,$$

With $\pi$ being indicative of an interleaver, $\pi_r$ is the r-bit reversal function and the LUT is a 2D look-up table that stores the moduli of the $2^r$ LCS recursions for n=2, 3, ..., 9.

Channel Interleaving

Figure 2B:
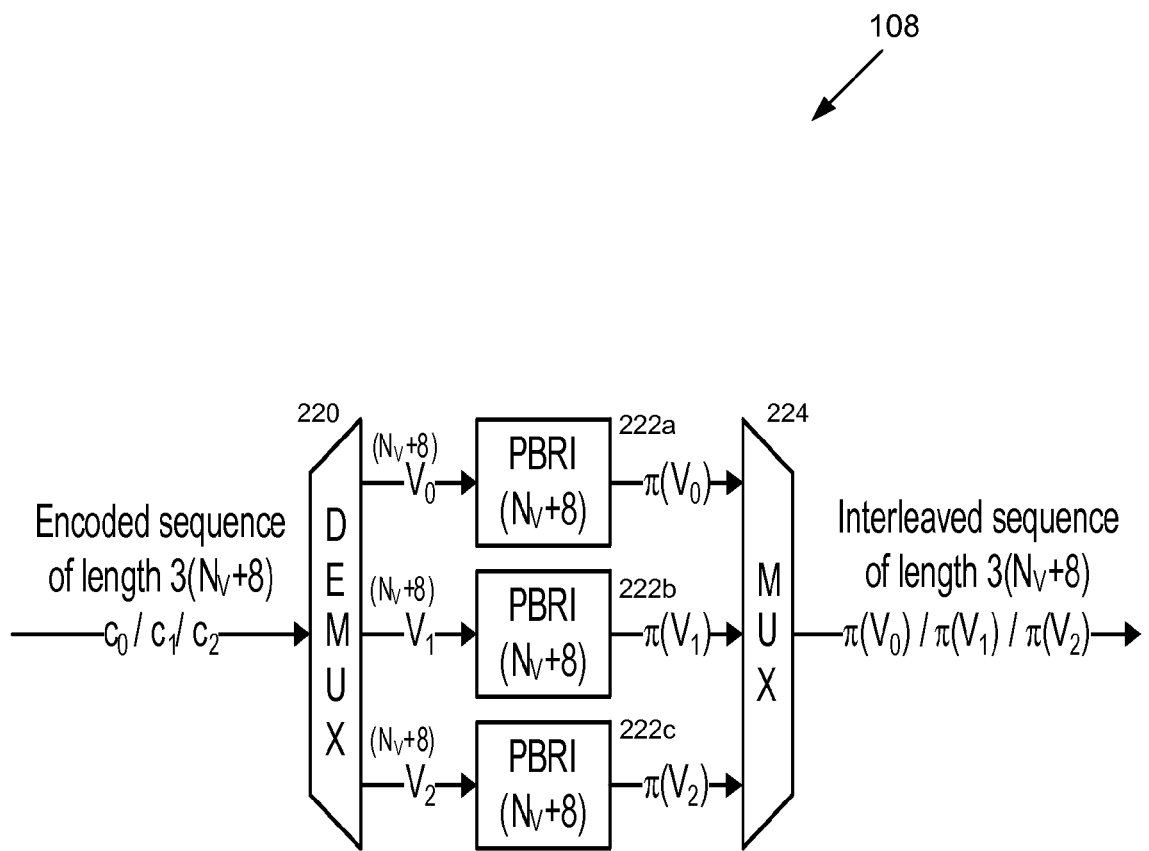
FIG. 2(b) is a block diagram of a parallel interleaver for convolutionally encoded sub-packets.

Channel interleaving is applied to encoded subpackets by channel interleaver 108 as shown in FIG. 1, and consists of a bit-demultiplexing operation followed by a bit-permuting operation. FIG. 2(b) is a block diagram of a parallel interleaver 108 for convolutionally encoded sub-packets, while FIG. 3(b) is a block diagram of a parallel interleaver 108 for turbo encoded sub-packets.

Referring to FIG. 2(b) for convolutionally encoded subpackets, the encoder output bits are demultiplexed into three sequences $V_0$, $V_1$, $V_2$, by demultiplexer 220 with the first bit going to $V_0$, the second bit going to $V_1$, the third going to $V_2$, and the fourth to $V_0$, etc. Next, each of the three sequences is bit-permuted independently using pruned bit-reversal interleavers (PBRIs) (222a-222c) to generate the sequences $\pi(V_0)$, $\pi(V_1)$, $\pi(V_2)$. A bit-reversal interleaver maps an n-bit number x into another n-bit number y according to a simple bit-reversal rule such that the bits of y appear in the reverse order with respect to x. A bit-reversal mapping on n bits is designated by the function $y=\pi_n(x)$. The values taken by x and y range from 0 to $2^n-1$, where $M=2^n$ is the size of the interleaver. A pruned bit-reversal interleaver maps an n-bit number x less than the (sub)packet length N, where $N \leq M$, into another n-bit number y less than N according to the bit-reversal rule. The size of the pruned interleaver is N, while the size of mother interleaver is M. The numbers from N to M-1 are pruned out of the interleaver mappings and are not considered valid mappings. The bit-permuted sequences $\pi(V_0)$, $\pi(V_1)$, $\pi(V_2)$, multiplexed by multiplexer 224, are abutted to generate the interleaved output.

Figure 3B:
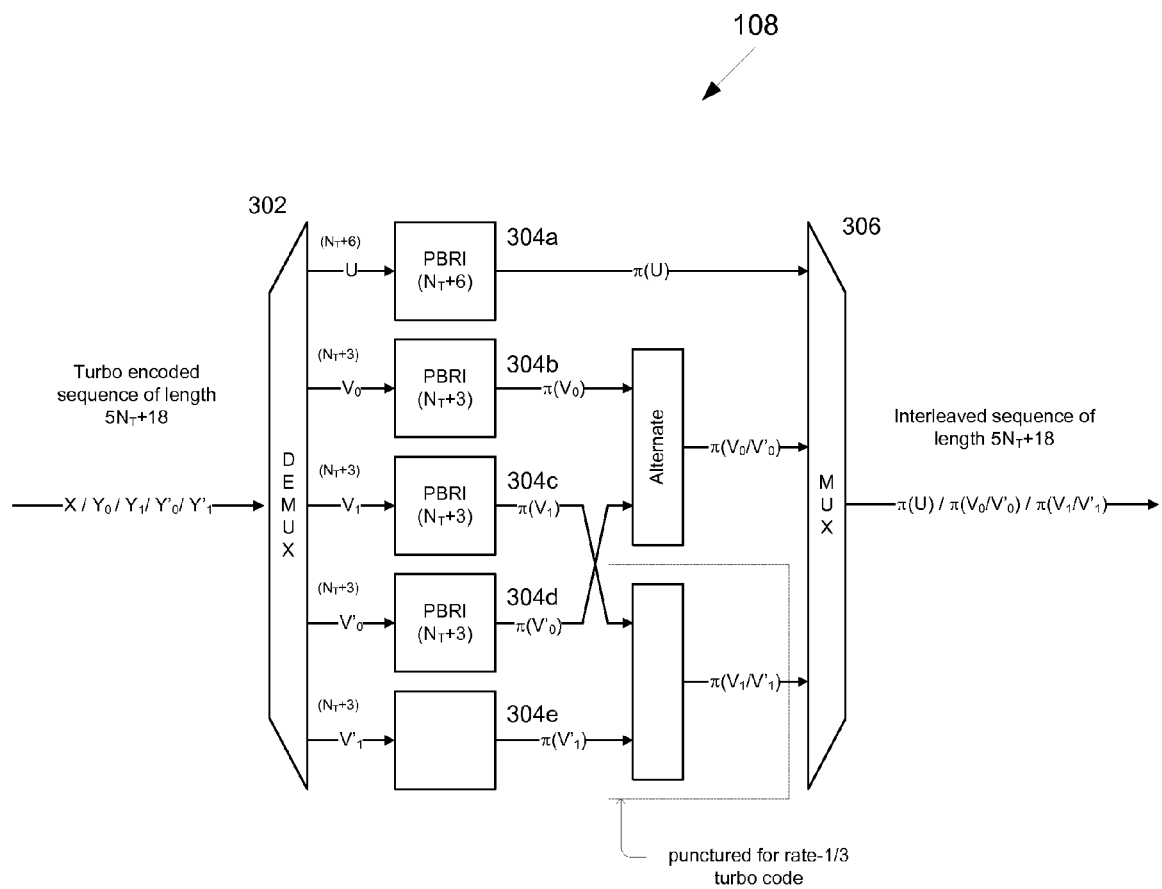
FIG. 3(b) is a block diagram of a parallel interleaver for turbo encoded sub-packets.

FIG. 3(b) is a block diagram of a channel interleaver 108 for turbo encoded sub-packets. For turbo encoded subpackets, the encoder 106 $5N_T$ output data bits are demultiplexed by demultiplexer 302 into five sequences U, $V_0$, $V_1$, $V'_0$, $V'_1$. The first encoder 106 output bit goes to the U sequence, the second to the $V_0$ sequence, the third to the $V_1$ sequence, the fourth to the $V'_0$ sequence, the fifth to the $V'_1$ sequence, the sixth to the U sequence, etc. The last 18 tail bits, numbered from 0 to 17, are demultiplexed as follows: Tail bits 0, 3, 6, 9, 12, and 15 go to sequence U, tail bits 1, 4, and 7 go to sequence $V_0$, tail bits 2, 5, and 8 go to sequence $V_1$, tail bits 10, 13, and 16 go to sequence $V'_0$, and tail bits 11, 14, and 17 go to sequence $V'_1$. As a result, sequence U has length $N_T+6$, while the other four sequences have length $N_T+3$.

Next, the demultiplexed sequences are bit-permuted using five Pruned Bit Reversal Interleavers (PBRIs) (304a-304e) into three separate interleaved blocks, denoted as $\pi(U)$, $\pi(V_0/V'_0)$, and $\pi(V_1/V'_1)$, as follows. The sequence U is permuted into the block π(U) using a length $N_T+6$ PBRI. Sequences $V_0$ and $V'_0$ are each permuted independently using a length $N_T+6$ PBRI into sequences $\pi(V_0)$ and $\pi(V'_0)$, respectively. The two sequences $\pi(V_0)$ and $\pi(V'_0)$ are then combined into the block $\pi(V_0/V'_0)$ by selecting bits from the two sequences in an alternating fashion, starting with $\pi(V_0)$. The length of the resulting $\pi(V_0/V'_0)$ block is $2N_T+6$. Similarly, the block $\pi(V_1/V'_1)$ is generated from the two sequences $V_1$ and $V'_1$. The three output blocks are then concatenated by Multiplexer 306 into the sequence $\pi(U)/\pi(V_0/V'_0)/\pi(V_1/V'_1)$ and generated as the channel interleaver 108 output.

Depending on the channel type and the hybrid automatic repeat-request (HARQ) interlacing structure determined by the Medium Access Control (MAC) protocol, four code rates of 1/5, 1/3, 1/2 and 2/3 are supported by puncturing bits from the blocks $\pi(V_0/V'_0)$ and $\pi(V_1/V'_1)$ as detailed below in FIG. 4. The resulting interleaved sequences are repeated by sequence repeater 110 and scrambled by data scrambler before being multiplexed and modulated by the Multiplexer and Modulation Symbol Mapper 114.

Figure 4:
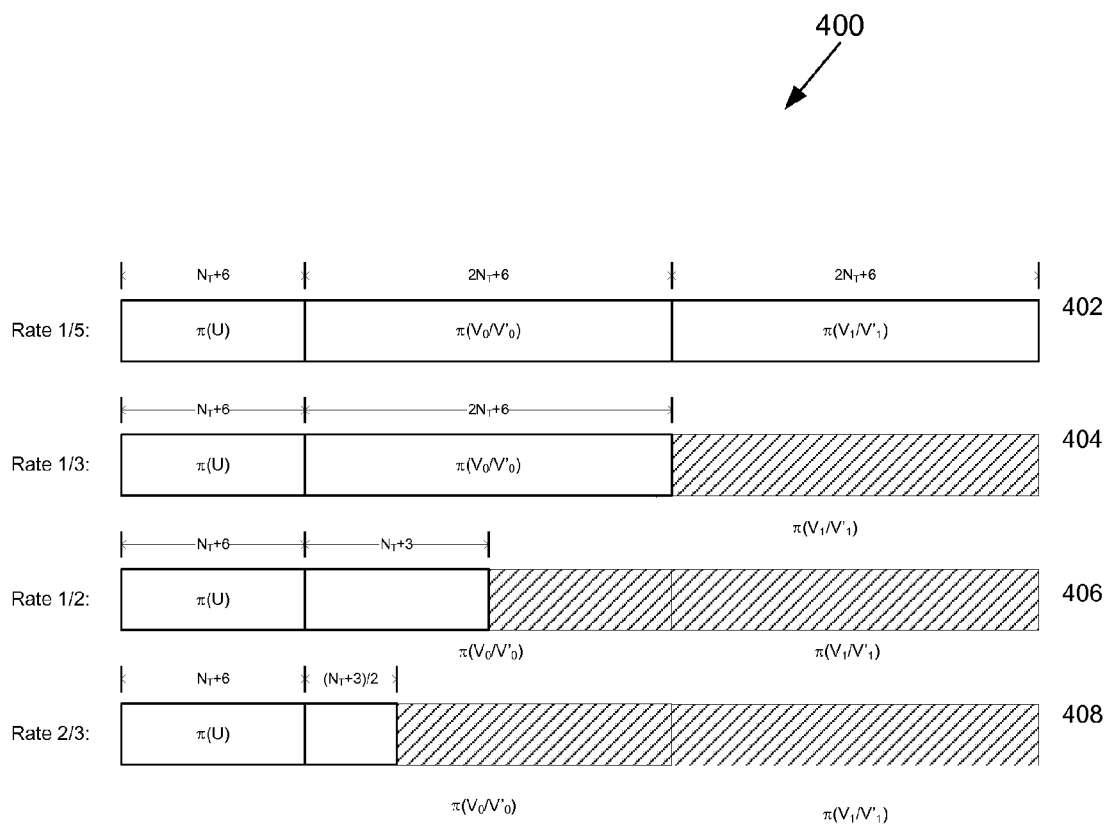
FIG. 4 shows the puncturing patterns for rate-1/5, 1/3, 1/2, and 2/3 turbo code.

FIG. 4 shows the codeword structure of turbo-encoded subpackets 400 for four different codes rates: rate-1/5 402, rate-1/3 404, rate-1/2 406, and rate-2/3 408. The structure of the rate-1/3 codeword 404 is similar to that of the rate-1/5 codeword 402 with the exception that the last symbols designated by $\pi(V_1/V'_1)$ symbols are pruned away. Similarly, for the rate-1/2 codeword 406, half of the $\pi(V_0/V'_0)$ symbols are additionally pruned. For the rate-2/3 codeword 408, three-fourths of the $\pi(V_0/V'_0)$ symbols and all $\pi(V_1/V'_1)$ symbols are pruned away.

Channel Deinterleaver Architecture

The functions described above used to generate the interleaver addresses are invertible. Thus, their inverse interleaver functions can be used to generate deinterleaver addresses.

Figure 5:
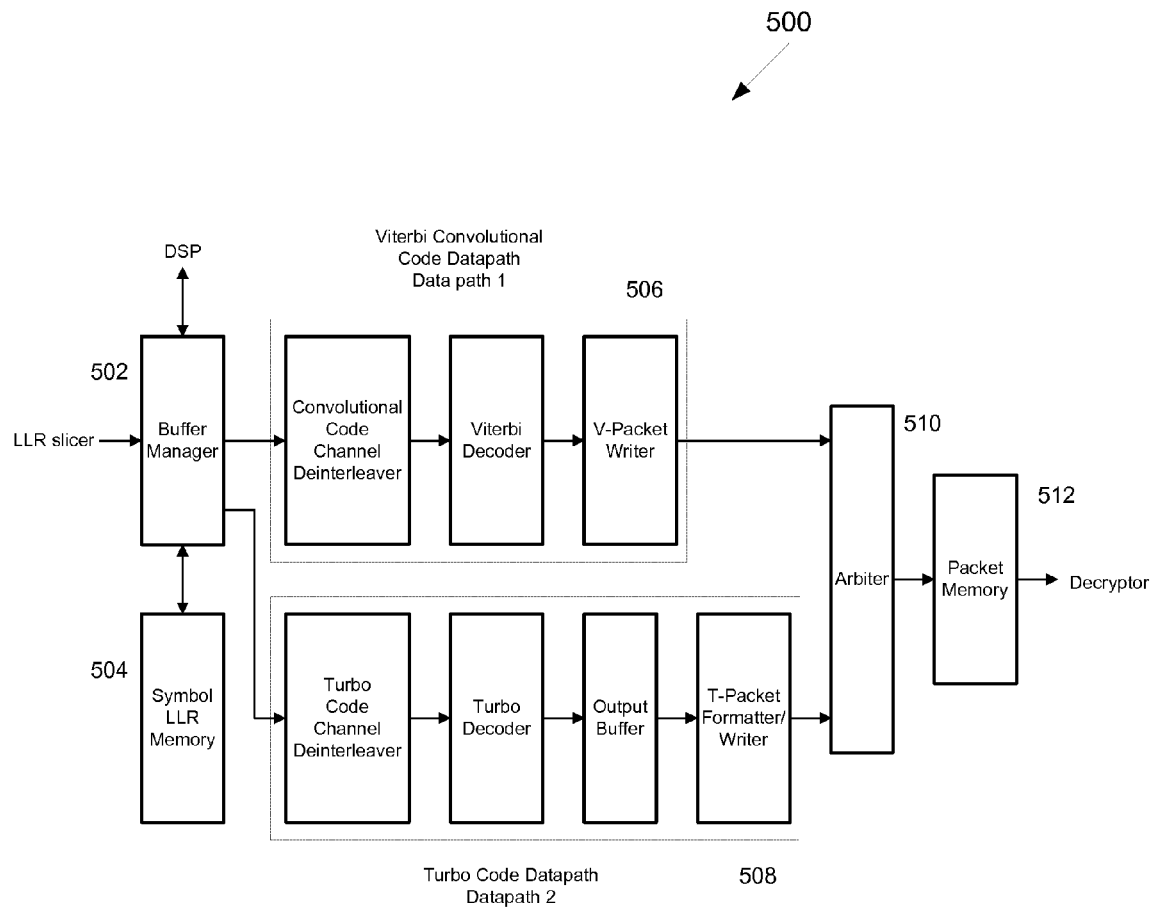
FIG. 5 shows an exemplary top-level architecture of a deinterleaver/decoder block that can be used for parallel deinterleaving.

FIG. 5 shows the top-level architecture of an exemplary deinterleaver/decoder block 500. The block has two independent datapaths for separately deinterleaving and decoding convolutionally encoded and turbo encoded subpackets. Data Path 1 506 deinterleaves and decodes convolutionally encoded subpackets. Data path 2 508 deinterleaves and decodes turbo encoded subpackets. A buffer manager 502 maintains symbol log likelihood ratio (LLR) values written into symbol LLR memory 504 by an external LLR slicer. An external Digital Signal Processor (DSP) issues commands to the buffer manager 502 to decode received packets. The buffer manager 502 requests the LLR symbols of all subpackets of the corresponding packet to be decoded from the LLR slicer and writes them into LLR memory 504. Depending on the packet type, the buffer manager 502 dispatches the constituent subpackets to either the turbo datapath (data path 2, 508) or the Viterbi convolutional code datapath (data path 1, 506). The Viterbi convolutional code datapath (data path 1, 506) is further detailed in FIG. 6(a). The Turbo code datapath (data path 2, 508) is further detailed in FIG. 7.

Subpackets can be dispatched in parallel to both datapaths (506 and 508). After decoding is complete, information bits of decoded subpackets from both datapaths (506 and 508) are formatted and written into an external packet memory 512 via an arbiter 510. Due to requirements of the system under consideration, the architecture of the symbol LLR memory 504, its bandwidth, and the way symbols are stored were designed to be standard-independent, with support for subpacket specifications for other standards such as LTE and WiMAX. Hence, the interface to LLR memory 504 can be made generic by employing a codeword reader from LLR memory 504 through the buffer manager 502, and by providing internal buffering of subpackets to be decoded inside the deinterleaver.

Deinterleaving for the Viterbi Convolutional Code Datapath

Figure 6A:
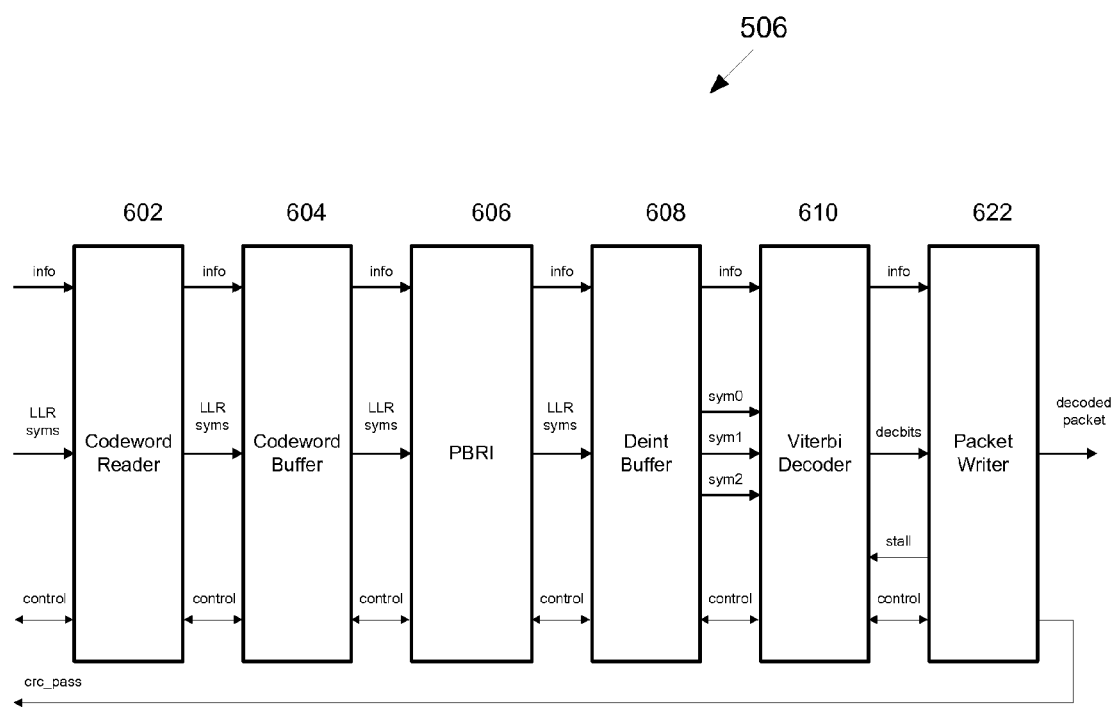
FIG. 6(a) shows a block diagram of an exemplary convolutional channel deinterleaver datapath.

FIG. 6(a) shows a more detailed block diagram of the exemplary convolutional channel deinterleaver datapath 506. The codeword reader 602 copies a packet length of LLR symbols into internal codeword buffer 604 where symbols are stored in sequential order. The subpacket length, puncturing length, and packet destination address are propagated along with the packet through each block of FIG. 6(a). Where less than $3(N_v+8)$ LLR symbols are available in LLR memory when a packet is output for decoding, the codeword reader 602 fills in zeros in the remaining punctured positions as it copies the subpacket LLRs into the codeword buffer 604.

The interleaving structure shown in FIG. 2(b) first requires splitting the packet into three sequences $\pi(V_0)$, $\pi(V_1)$, $\pi(V_2)$. These three sequences are interleaved by the PBRI block 606. Because the three sequences have the same length, the interleaving can be performed by a single PBRI block 606. The actual PBRI mapping, described in FIGS. 3(b) and 4, is the same operation for interleaving and deinterleaving The PBRI block 606 must generate a valid interleaved address every clock cycle. However, due to the pruning operation, the bit-reversed address of a linear address x might not be a valid address, i.e. $\pi(x) \geq N_T+8$. The property is used that two consecutive linear addresses cannot both have invalid interleaved addresses in generating a valid interleaved address every clock cycle as shown using the sequential PBRI in FIG. 6(b). This follows from the fact that the length of the mother interleaver ($2^n$) cannot exceed twice the length of the sequence to be interleaved, and that if $\pi(x) \geq N_T+8$, then the least significant bit of the n-bit address x must be 1, which implies that the least-significant bit of address x+1 must be 0, which implies that $\pi(x+1) < N_T+8$, and hence $\pi(x+1)$ is valid. The deinterleaving buffer 608, Viterbi decoder 610 and packet writer 612 complete the deinterleaving operation for convoltionally encoded subpackets.

Figure 6B:
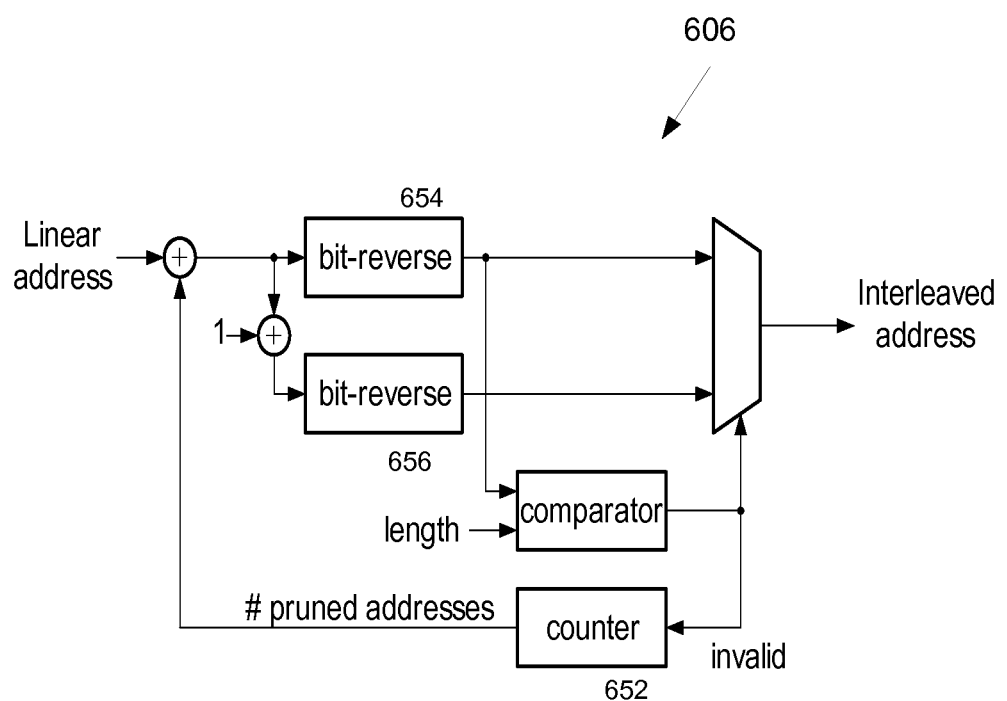
FIG. 6(b) details exemplary functionality of the PBRI block illustrated in FIG. 6(a)

FIG. 6(b) details the functionality of the PBRI block illustrated in FIG. 6(a). A counter 652 maintains the number of invalid bit-reversed addresses starting from zero. The count is added to the current linear address x, which is then bit-reversed by bit reverse elements 654 and 656 together with x+1. If $\pi(x) \leq N_T+8$, then the counter 652 is not updated and $\pi(x)$ is the resulting interleaved address. Otherwise, the counter 652 is advanced and $\pi(x+1)$ is the resulting valid interleaved address. In other embodiments, this method can be generalized to generate more than one valid interleaved address every clock cycle, at the expense of increased complexity. A low-complexity parallel look ahead scheme that interleaves an address x in O(log(x)) complexity as opposed to O(x) complexity for the sequential PBRI was proposed in U.S. patent application Ser. No. 12/264,880, filed Nov. 4, 2008 and it is incorporated by reference herein. However, for the throughput requirements of the system under consideration, generating only one valid interleaved address every clock cycle using a sequential PBRI is sufficient.

With reference to FIG. 6(a) the PRBI block 606 uses the same or similar interleaver as that shown in FIG. 2(a). However the PRBI block 606 operates such that output addresses are mapped to input addresses according to the inverse interleaver function $\pi^{-1}$. Data is likewise deinterleaved. The resulting deinterleaved sequences are written into a deinterleaver buffer 608. A Viterbi decoder 610 then reads the deinterleaved symbols of a packet from this buffer 608 and passes the decoded hard decision bits to a packet writer 612, which stores the bits into external decoded packet memory. In one embodiment, the packet writer 612 is coupled to a high-priority cycle-stealing port on the arbiter 510, which grants quick access to the external bus to the packet memory to write the 112 (=128−24) decoded bits in two cycles. Therefore, output buffering is not necessary to store the decoded output bits from the Viterbi decoder 610. In cases where the packet writer 612 is not granted bus access, the Viterbi decoder 610 is stalled. All buffers utilized in FIG. 6(a) are double-buffers, which allow simultaneous operation of adjacent blocks on back-to-back packets.

Deinterleaving for the Turbo Code Datapath

Figure 7:
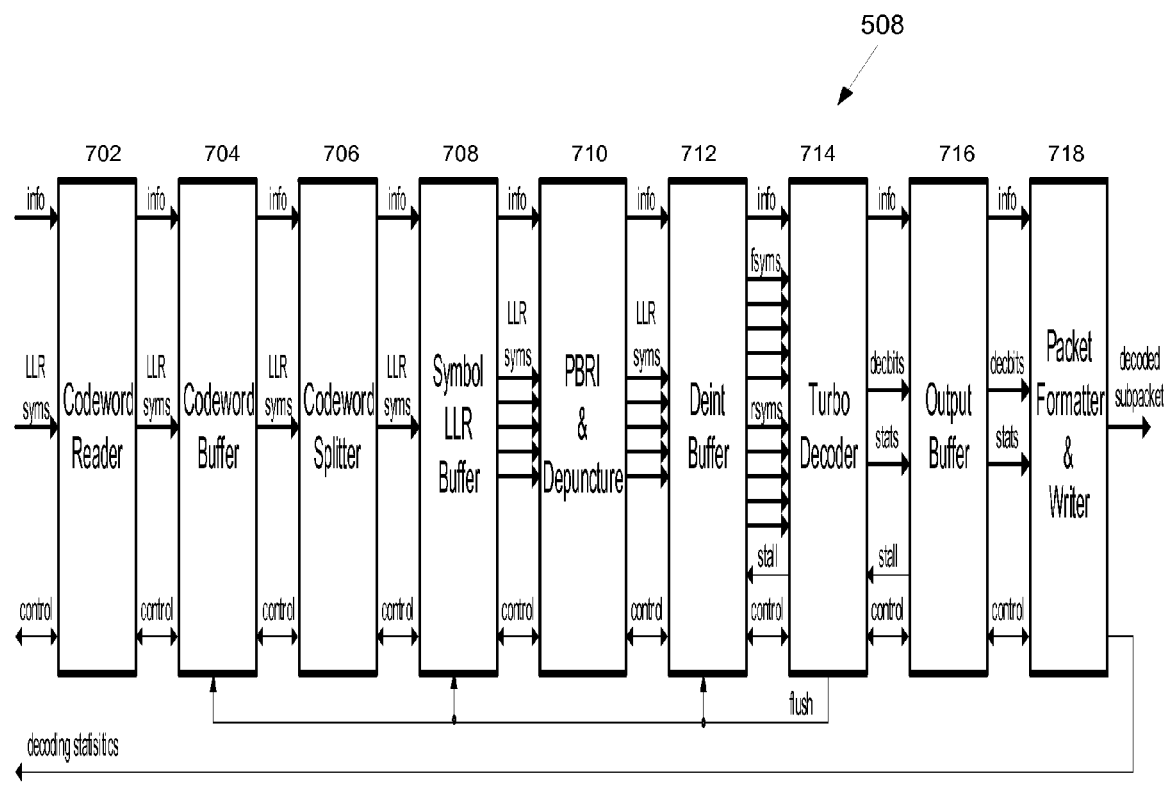
FIG. 7 shows a block diagram of an exemplary turbo channel deinterleaver datapath.

FIG. 7 shows a block diagram of the turbo channel deinterleaver datapath 508. Similar to the Viterbi channel deinterleaver datapath shown in FIG. 6(a), a codeword reader block 702 copies a packet length of LLR symbols into internal codeword buffer 704, where symbols are stored in sequential order. Depending on a Hybrid Automatic Repeat Request (HARQ) interlacing structure, the codeword reader 702 inserts zero LLRs in punctured positions when copying the subpacket LLRs into the codeword buffer 704. The symbol interleaving scheme shown in FIG. 3(b), first requires splitting the subpacket on the input side of the interleaver into three sequences $\pi(U)$, $\pi(V_0/V'_0)$, $\pi(V_1/V'_1)$, then splitting $\pi(V_0/V'_0)$ into $\pi(V_0)$ and $\pi(V'_0)$, and splitting $\pi(V_1/V'_1)$ into $\pi(V_1)$ and $\pi(V'_1)$. The inverse of this is accomplished, for instance at the receiver, with the interleaver operating to produce an inverse interleaving function $\pi^1$. As such, still with reference to FIG. 6(a), the deinterleaving of the five sequences $\pi(U)$, $\pi(V_0)$, $\pi(V'_0)$, $\pi(V_1)$ and $\pi(V'_1)$ is accomplished using a pruned bit-reversal interleaver 710. A codeword splitter 706 performs the splitting task and writes the resulting LLR symbols to a symbol buffer 708, which is composed of five memory banks ($U/V_0/V'_0/V_1/V'_1$). The length of $\pi(U)$ is $N_T+6$, while the length of the remaining four sequences is $N_T+3$. The PBRI block 710 performs deinterleaving of the five sequences in parallel using two PBRI blocks similar to that shown in FIG. 6(b), one with mother length $N_T+6$, and one with mother length $N_T+8$.

Figure 8A:
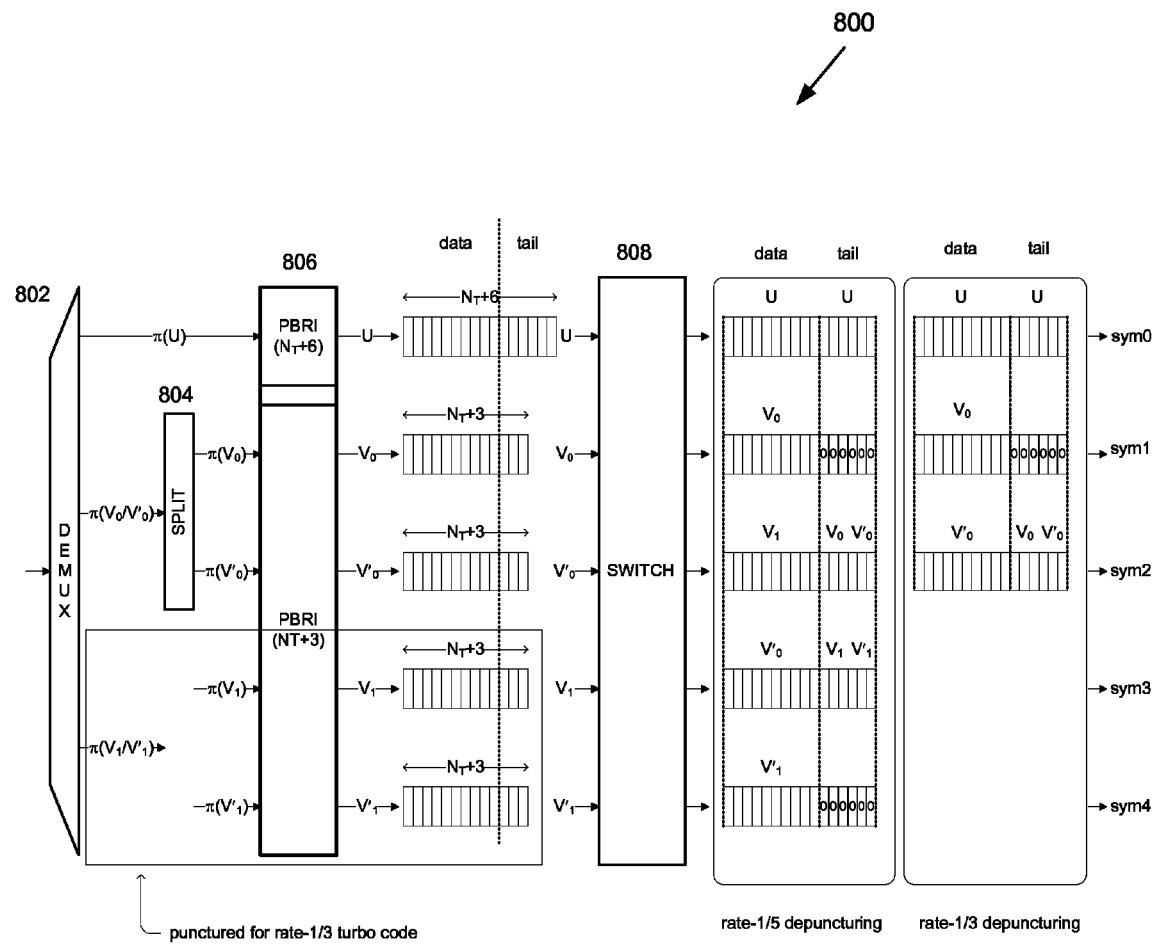
FIG. 8(a) further details exemplary operations of the turbo codeword splitter and the PBRI blocks.

FIG. 8(a) further details exemplary operations 800 of the codeword splitter 706 and the PBRI blocks 710. FIG. 8(a) also shows depuncturing operations performed on the tail bits of the five deinterleaved sequences before passing them to the turbo decoder 714. The turbo decoder 714 expects five LLR symbols corresponding to the five turbo encoder output bits generated for every input bit when decoding a rate-1/5 code. The first three symbols are passed to the first constituent decoder 302, while the first and last two symbols are passed to the second constituent decoder 304. Hence for the six tail bits, a total of 30 LLR symbols are required. However, the five deinterleaved sequences generate only 6+4×3=18 tail symbols. The remaining 12 LLR symbols are inserted by extending the four sequences $V_0$, $V'_0$, $V_1$ and $V'_1$ into $N_T+6$ symbols and filling in zeros. For compatibility issues with earlier EV-DO Rev. A data rates and puncturing patterns, the tail bits of $V_0$ are moved to the third sequence, and those for $V'_1$ are moved to the fourth sequence. The depuncturing patterns for the rate-1/3 code are also shown.

The input demux 802 decomposes the incoming stream of symbols into $\pi\iota(U)$, $\pi\iota(V_0/V'_0)$, and $\pi\iota(V_1/V'_1)$. A splitter 804 further splits $\pi\iota(V_0/V'_0)$ into $\pi\iota(V_0)$ and $\pi\iota(V'_0)$, and $\pi\iota(V_1/V'_1)$ into $\pi\iota(V_1)$ and $\pi\iota(V'_1)$. The five streams $\pi\iota(U)$, $\pi\iota(V_0)$, $\pi\iota(V'_0)$, $\pi\iota(V_1)$, $pi(V'_1)$ are then independently permuted using a PBRI 806 to generate the streams $U$, $V_0$, $V'_0$, $V_1$, $V'_1$. The structure of these streams is shown at the output of the PBRI blocks 806 in the figure: U contains $N_T$ data symbols and 6 tail symbols, while the remaining 4 streams each contain $N_T$ data symbols and 3 tails symbols. A switch 808 then performs depuncturing operations on these streams to produce the outputs, sym0-sym4. For rate-1/5 depuncturing, five streams are produced (U, $V_0$, $V_1$, $V'_0$, $V'_1$ in this order), while for rate-1/3 depuncturing only 3 streams are produced (U, $V_0$, $V'_0$ in this order). Zeros are inserted in the tail symbols.

Depuncturing operations performed on the tail bits are further detailed below. Note that these streams must be passed to the turbo decoder 714, which expects five symbols corresponding to the five turbo encoder output bits generated for every input bit when decoding a rate-1/5 code. The first three symbols are passed to the first constituent decoder 302, while the first and last two symbols are passed to the second constituent decoder 304. Hence for the six tail bits, a total of 30 symbols are required. However, the five deinterleaved sequences generate only 6+4*3=18 tail symbols. The remaining 12 symbols are inserted by extending the four sequences $V_0$, $V'_0$, $V_1$ and $V'_1$ into $N_T+6$ symbols and filling in zeros as shown. For compatibility issues with earlier EV-DO Rev-A data rates and puncturing patterns, the tail bits of $V_0$ are moved to the third sequence, and those for $V'_1$ are moved to the fourth sequence. The depuncturing patterns for the rate-1/3 code are also shown. The resulting deinterleaved/depunctured rate-1/5 and rate-1/3 subpacket structure of the operations are further detailed in FIG. 8(b).

The deinterleaved symbols output by the PBRI block 806 are written into a deinterleaver buffer 712, which controls the operation of the turbo decoder 714. For each decoding iteration, the turbo decoder 714 reads forward and back LLR symbols in parallel from the deinterleaver buffer 712. Upon completion, it writes the decoded output decision bits into an output buffer 716 together with other decoding statistics about the decoded subpacket. In one embodiment, the output buffer 716 is a circular buffer than can hold up to eight decoded subpackets. The packet writer block 718 removes the CRC bits and writes the information bits of all decoded subpackets corresponding to the same packet into the external packet memory through an arbiter 510. Subpackets belonging to the same packet are abutted to each other in packet memory. Where any subpacket fails to decode, the turbo decoder 714 flushes the internal buffers (704, 708, 712, 716) in the turbo code datapath. If the output buffer 716 is full, then the turbo decoder is stalled until the packet writer 718 is granted access to the external bus to empty subpackets from the output buffer 716.

Figure 8B:
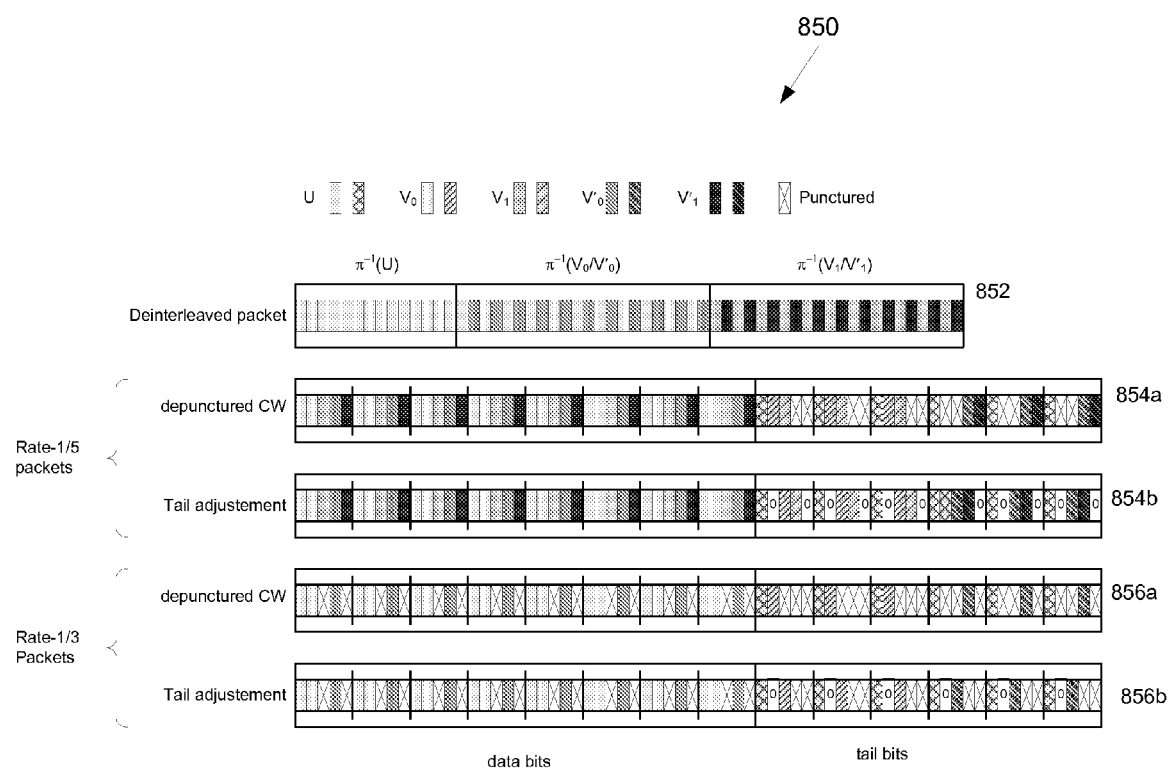
FIG. 8(b) details exemplary deinterleaved/depunctured rate-1/5 and rate-1/3 turbo packet structures.

FIG. 8(b) shows the deinterleaved/depunctured rate-1/5 and rate-1/3 packet structures 850 resulting from the operations detailed in FIG. 8(a). Deinterleaved packet 852 is the final deinterleaved sub-packet before depuncturing. 1/5-rate packets 854a and 854b show the resulting structure after depuncturing and tail adjustment for the rate-1/5 case. 1/3-rate packets 856a and 856b likewise correspond to the rate-1/3 case. These packets (854a, 854b, 856a, 856b) are known in the art as "codewords". By comparing the depunctured codeword 854a to the deinterleaved packet 852, the construction of a rate-1/5 codeword is determined, where X's designate punctured symbols. Rate-1/5 packet 854b illustrates zeros inserted tail symbols. By comparing the depunctured codeword 856a to the deinterleaved packet 852, the construction of a rate-1/3 codeword is determined, where X's designate punctured symbols. Rate-1/3 packet 856b illustrates zeros inserted tail symbols.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method of interleaving data packets comprising:
   demultiplexing, using a demultiplexer, encoded bits of a data packet into a plurality of demultiplexed sequences;
   splitting at least one of the plurality of demultiplexed sequences into at least two demultiplexed sequences prior to applying the pruned bit reversal interleaver function to the demultiplexed sequences;
   applying, using a pruned bit reversal interleaver, a pruned bit reversal interleaver function to the demultiplexed sequences to generate bit-permutated sequences; and
   multiplexing, using a multiplexer, the bit-permutated sequences to generate interleaved data packets.

2. The method of claim 1 wherein the demultiplexing comprises demultiplexing bits of a convolutionally encoded data packet.

3. The method of claim 1 wherein the demultiplexing comprises demultiplexing bits of a turbo encoded data packet.

4. The method of claim 3 wherein a deinterleaved/depunctured rate-1/5 data packet is generated.

5. The method of claim 3 wherein a deinterleaved/depunctured rate-1/3 data packet is generated.

6. The method of claim 1 wherein a reverse pruned bit reversal interleaver function is applied to deinterleave the interleaved data packet.

7. An apparatus for interleaving data packets comprising:
   a demultiplexer for demultiplexing encoded bits of a data packet into a plurality of demultiplexed sequences;
   a splitter configured to split at least one of the plurality of demultiplexed sequences into at least two demultiplexed sequences that are input to the pruned bit reversal interleaver;
   a pruned bit reversal interleaver for generating bit-permutated sequences from the demultiplexed sequences; and
   a multiplexer for multiplexing the bit-permutated sequences to generate interleaved data packets.

8. The apparatus of claim 7 wherein the demultiplexer demultiplexes bits of a convolutionally encoded data packet.

9. The apparatus of claim 7 wherein the demultiplexing comprises demultiplexing bits of a turbo encoded data packet.

10. The apparatus of claim 9 wherein the multiplexer generates a deinterleaved/depunctured rate-1/5 data packet.

11. The apparatus of claim 9 wherein the multiplexer generates a deinterleaved/depunctured rate-1/3 data packet.

12. The apparatus of claim 7 wherein a reverse pruned bit reversal interleaver deinterleaves an interleaved data packet.

13. An apparatus for interleaving data packets comprising:
   means for demultiplexing encoded bits of a data packet into a plurality of demultiplexed sequences;
   means for splitting at least one of the plurality of demultiplexed sequences into at least two demultiplexed sequences prior to applying the pruned bit reversal interleaver function to the demultiplexed sequences;
   means for bit reversal interleaving for generating bit-permutated sequences from the demultiplexed sequences; and
   means for multiplexing the bit-permutated sequences to generate interleaved data packets.

14. A non-transitory computer readable medium having instructions stored thereon to cause an interleaver in a wireless communication system to:
   demultiplex encoded bits of a data packet into a plurality of demultiplexed sequences;
   split at least one of the plurality of demultiplexed sequences into at least two demultiplexed sequences prior to applying the pruned bit reversal interleaver function to the demultiplexed sequences;
   apply a pruned bit reversal interleaver function to the demultiplexed sequences to generate bit-permutated sequences; and
   multiplex the bit-permutated sequences to generate interleaved data packets.

15. The computer readable medium of claim 14 wherein the demultiplexing comprises demultiplexing bits of a convolutionally encoded data packet.

16. The computer readable medium of claim 14 wherein the demultiplexing comprises demultiplexing bits of a turbo encoded data packet.

17. The computer readable medium of claim 14 wherein a deinterleaved/depunctured rate-1/5 data packet is generated.

18. The computer readable medium of claim 14 wherein a deinterleaved/depunctured rate-1/3 data packet is generated.

19. The computer readable medium of claim 14 wherein a reverse pruned bit reversal interleaver function is applied to deinterleave the interleaved data packet.

20. The method of claim 1 further comprising:
   alternately selecting bits from at least two of the generated bit-permutated sequences to generate a combined output block from the at least two sequences that is input to the multiplexer.

21. The apparatus of claim 7, further comprising:
   an alternating circuit configured to select bits from at least two of the generated bit-permutated sequences to generate a combined output block from the at least two sequences that is input to the multiplexer.

22. The apparatus of claim 13, further comprising:
   means for alternately selecting bits from at least two of the generated bit-permutated sequences to generate a combined output block from the at least two sequences that is input to the multiplexer.

* * * * *